United States Patent
Yu et al.

(10) Patent No.: US 10,529,666 B2
(45) Date of Patent: Jan. 7, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chen-Hua Yu, Hsinchu (TW); Kai-Chiang Wu, Hsinchu (TW); Chun-Lin Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/459,691

(22) Filed: Mar. 15, 2017

(65) Prior Publication Data
US 2018/0151501 A1 May 31, 2018

Related U.S. Application Data

(60) Provisional application No. 62/427,651, filed on Nov. 29, 2016.

(51) Int. Cl.
| | |
|---|---|
| H01L 23/538 | (2006.01) |
| H01L 23/31 | (2006.01) |
| H01L 25/00 | (2006.01) |
| H01L 25/065 | (2006.01) |
| H01L 23/00 | (2006.01) |
| H01L 21/56 | (2006.01) |

(52) U.S. Cl.
CPC ........ *H01L 23/5389* (2013.01); *H01L 21/565* (2013.01); *H01L 21/566* (2013.01); *H01L 23/3114* (2013.01); *H01L 23/3128* (2013.01); *H01L 23/3135* (2013.01); *H01L 23/5383* (2013.01); *H01L 23/5384* (2013.01); *H01L 23/5386* (2013.01); *H01L 24/19* (2013.01); *H01L 24/20* (2013.01); *H01L 25/0652* (2013.01); *H01L 25/50* (2013.01); *H01L 21/568* (2013.01); *H01L 2224/04105* (2013.01); *H01L 2224/08225* (2013.01); *H01L 2224/12105* (2013.01); *H01L 2224/16227* (2013.01); *H01L 2224/73204* (2013.01); *H01L 2224/73267* (2013.01); *H01L 2224/80006* (2013.01); *H01L 2924/15192* (2013.01)

(58) Field of Classification Search
None
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |

(Continued)

*Primary Examiner* — Khaja Ahmad
(74) *Attorney, Agent, or Firm* — WPAT, P.C.; Anthony King

(57) ABSTRACT

A semiconductor structure includes a first die; a first molding encapsulating the first die; a second die disposed over the first molding, and including a first surface, a second surface opposite to the first surface, and a sidewall between the first surface and the second surface; and a second molding disposed over the first molding and surrounding the second die, wherein the first surface of the second die faces the first molding, and the second die is at least partially covered by the second molding.

17 Claims, 19 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2006/0126313 A1* | 6/2006 | Steiner .................. H01L 21/56 361/760 |
| 2008/0272477 A1* | 11/2008 | Do ..................... H01L 21/76898 257/686 |
| 2010/0207140 A1* | 8/2010 | Rudaz ................. H01L 33/486 257/98 |
| 2013/0075937 A1* | 3/2013 | Wang ................. H01L 25/0655 257/782 |
| 2013/0208426 A1* | 8/2013 | Kim ..................... H01L 23/36 361/717 |
| 2014/0103488 A1* | 4/2014 | Chen ..................... H01L 24/83 257/532 |
| 2014/0103527 A1* | 4/2014 | Marimuthu ......... H01L 21/6835 257/737 |
| 2014/0185264 A1* | 7/2014 | Chen ................. H01L 23/3128 361/814 |
| 2015/0171024 A1* | 6/2015 | Choi ..................... H01L 24/97 257/774 |
| 2015/0171028 A1* | 6/2015 | Jo ........................ H01L 23/562 257/713 |
| 2015/0255426 A1* | 9/2015 | Son .................... H01L 21/6835 257/738 |
| 2016/0260684 A1* | 9/2016 | Zhai ................... H01L 25/0652 |
| 2017/0077022 A1* | 3/2017 | Scanlan ............ H01L 23/49838 |

* cited by examiner

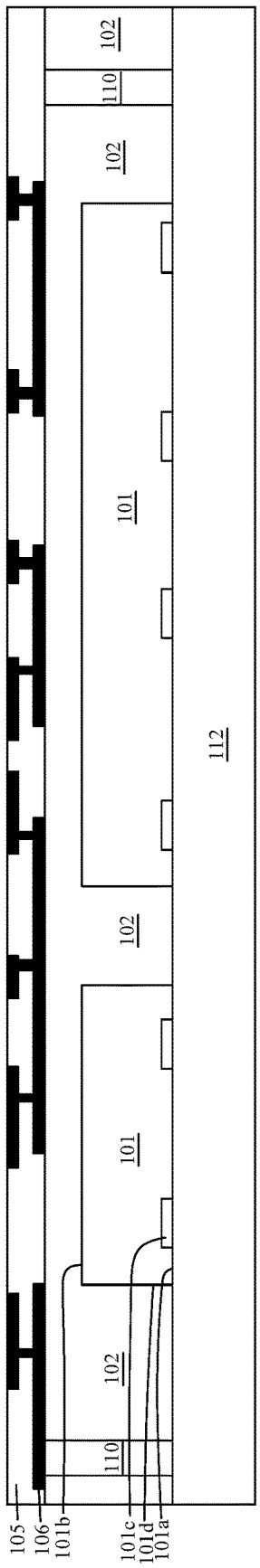

SEMICONDUCTOR STRUCTURE AND MANUFACTURING METHOD THEREOF

PRIORITY CLAIM AND CROSS-REFERENCE

This application claims priority to U.S. Provisional Application No. 62/427,651 filed on Nov. 29, 2016, entitled "Semiconductor Structure and Manufacturing Method Thereof," which application is hereby incorporated herein by reference.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 12A-12J are schematic views of manufacturing a semiconductor structure by a method of FIG. 12 in accordance with some embodiments of the present disclosure.

DETAILED DESCRIPTION OF THE DISCLOSURE

Figure 1:
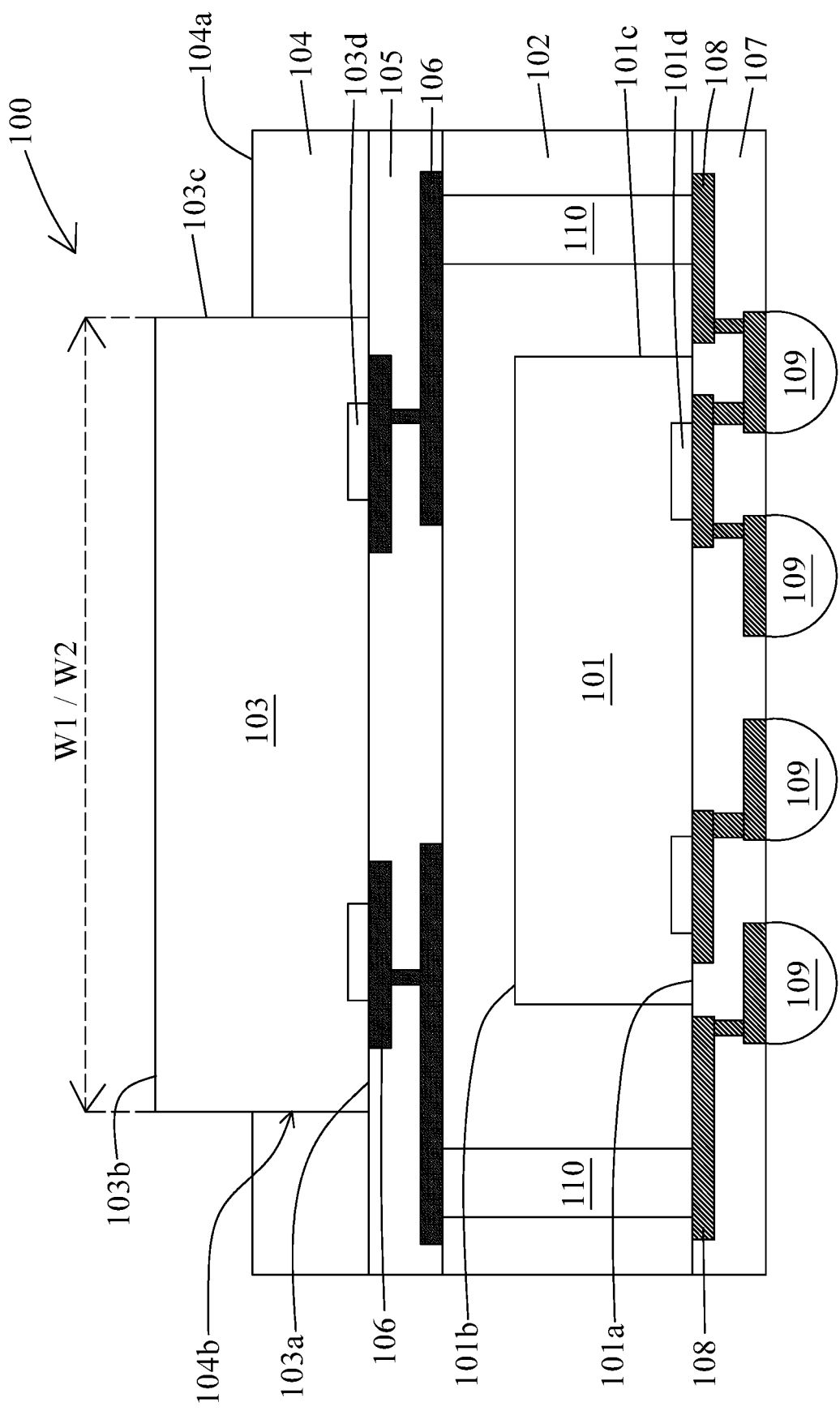
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, and the die is electrically connected to another dies or packages by a via extending through the molding. The dies or packages are encapsulated by molding. However, such configuration may not be suitable for dies or packages which are configured for sensing purpose or configured as a sensor. For example, a die or a package is required to be partially or entirely exposed from the molding in order to perform the sensing function.

In the present disclosure, a semiconductor structure with improvement is disclosed. The semiconductor structure includes a die (or a package) at least partially exposed from a molding. A predetermined portion of a surface of the die or a predetermined surface of the die is exposed from the molding in accordance with design requirements. A design of a mold chase is modified in order to form the molding which exposes at least a portion or a surface of the die. Therefore, the die with exposed portion or exposed surface facilitates predetermined sensing function.

FIG. 1 is a schematic cross sectional view of a semiconductor structure 100 in accordance with various embodiments of the present disclosure. In some embodiments, the semiconductor structure 100 includes a first die 101, a first molding 102, a second die 103 and a second molding 104. In some embodiments, the semiconductor structure 100 is a semiconductor package. In some embodiments, the semiconductor structure 100 is an integrated fan out (InFO) package, where I/O terminals of the first die 101 are fanned out and redistributed over a surface of the first die 101 in a greater area. In some embodiments, the semiconductor structure 100 is configured to perform sensing function.

In some embodiments, the first die 101 is fabricated with a predetermined functional circuit within the first die 101. In some embodiments, the first die 101 is singulated from a semiconductive wafer by a mechanical or laser blade. In some embodiments, the first die 101 comprises a variety of electrical circuits suitable for a particular application. In some embodiments, the electrical circuits include various devices such as transistors, capacitors, resistors, diodes and/or the like.

In some embodiments, the first die 101 comprises of any one of various known types of semiconductor devices such as memories (such as SRAMS, flash memories, etc.), microprocessors, application-specific integrated circuits (ASICs), or the like. In some embodiments, the first die 101 is a logic device die, central computing unit (CPU) die, or the like. In some embodiments, the first die 101 is a system on chip (SOC) that integrates all electronic components into a single die. In some embodiments, the first die 101 is a die, a chip or a package. In some embodiments, the first die 101 has a top cross section (a cross section from the top view of the semiconductor structure 100 as shown in FIG. 1) in a quadrilateral, a rectangular or a square shape.

In some embodiments, the first die 101 includes a substrate which comprises semiconductive materials such as silicon. In some embodiments, the substrate of the first die 101 includes several circuitries and electrical components disposed thereon. In some embodiments, the substrate of the first die 101 is a silicon substrate. In some embodiments, the first die 101 includes a top surface 101a, a bottom surface 101b opposite to the top surface 101a, a sidewall 101c, and a first conductive pad 101d disposed over or within the top surface 101a. In some embodiments, the top surface 101a is a front side or active side of the first die 101. In some embodiments, the bottom surface 101b is a back side or inactive side of the first die 101. In some embodiments, the sidewall 101c is substantially orthogonal to the top surface 101a and the bottom surface 101b. In some embodiments, the sidewall 101c is disposed between the top surface 101a and the bottom surface 101b.

In some embodiments, the first conductive pad 101d is electrically connected to a circuitry external to the first die 101, such that a circuitry of the first die 101 is electrically connected to the circuitry external to the first die 101 through the first conductive pad 101d. In some embodiments, the first conductive pad 101d is configured to electrically couple with a conductive trace or a conductive structure. In some embodiments, the first conductive pad 101d includes gold, silver, copper, nickel, tungsten, aluminum, palladium and/or alloys thereof.

In some embodiments, the first molding 102 surrounds or encapsulates the first die 101. In some embodiments, all surfaces of the first die 101 are interfaced with the first molding 102. In some embodiments, the top surface 101a and the sidewall 101c of the first die 101 are interfaced with or in contact to the first molding 102. In some embodiments, the first molding 102 can be a single layer film or a composite stack. In some embodiments, the first molding 102 includes various materials, such as molding compound, molding underfill, epoxy, resin, or the like. In some embodiments, the first molding 102 has a high thermal conductivity, a low moisture absorption rate and a high flexural strength.

In some embodiments, the second die 103 is disposed over the first molding 102. In some embodiments, the second die 103 is fabricated with a predetermined functional circuit within the second die 103. In some embodiments, the second die 103 comprises a variety of electrical circuits suitable for a particular application. In some embodiments, the second die 103 is configured to perform sensing function.

In some embodiments, the electrical circuits include various devices such as transistors, capacitors, resistors, diodes and/or the like. In some embodiments, the second die 103 comprises of any one of various known types of semiconductor devices such as memories (such as SRAMS, flash memories, etc.), microprocessors, application-specific integrated circuits (ASICs), or the like. In some embodiments, the second die 103 is a die, a chip or a package. In some embodiments, the second die 103 is a sensor or a sensing package. In some embodiments, the second die 103 has a top cross section (a cross section from the top view of the semiconductor structure 100 as shown in FIG. 1) in a quadrilateral, a rectangular or a square shape.

In some embodiments, the second die 103 includes a substrate which comprises semiconductive materials such as silicon. In some embodiments, the substrate of the second die 103 includes several circuitries and electrical components disposed thereon. In some embodiments, the substrate of the second die 103 is a silicon substrate. In some embodiments, second die 103 includes a first surface 103a, a second surface 103b opposite to the first surface 103a, a sidewall 103c, and a second conductive pad 103d disposed over or within the first surface 103a.

In some embodiments, the first surface 103a is a front side or active side of the second die 103. In some embodiments, the second surface 103b is a back side or inactive side of the second die 103. In some embodiments, the first surface 103a of the second die 103 faces the first molding 102. In some embodiments, the sidewall 103c is substantially orthogonal to the first surface 103a and the second surface 103b. In some embodiments, the sidewall 103c is disposed between the first surface 103a and the second surface 130b. In some embodiments, a sensing element in the second die 103 is configured to transmit or receive a signal from ambient environment through the second surface 103b or the sidewall 103c. In some embodiments, the sensing element is a transmitter, a receiver, a transceiver, or etc.

In some embodiments, the second conductive pad 103d is electrically connected to a circuitry external to the second die 103, such that a circuitry of the second die 103 is electrically connected to the circuitry external to the second die 103 through the second conductive pad 103d. In some embodiments, the second conductive pad 103d is configured to electrically couple with a conductive trace or a conductive structure. In some embodiments, the second conductive pad 103d includes gold, silver, copper, nickel, tungsten, aluminum, palladium and/or alloys thereof.

In some embodiments, the second molding 104 is disposed over the first molding 102 and surrounds the second die 103. In some embodiments, the second die 103 is at least partially exposed from the second molding 104. In some embodiments, a portion of the second die 103 is protruded from the second molding 104. In some embodiments, the second surface 103b or the sidewall 103c of the second die 103 is partially or entirely exposed from the second molding 104. In some embodiments, the entire second surface 103b of the second die 103 is exposed from the second molding 104. In some embodiments, a portion of the sidewall 103c of the second die 103 is interfaced with or in contact with the second molding 104, and another portion of the sidewall 103c of the second die 103 is exposed from the second molding 104. In some embodiments, the second surface 103b of the second die 103 is at a level substantially higher than a level of a top surface 104a of the second molding 104. In some embodiments, the second surface 103b or the sidewall 103c is partially or entirely exposed to ambient environment. In some embodiments, the second surface 103b or the sidewall 103c is not covered by or is not in contact with any component, such that the sensing element in the second die 103 can sense, transmit or receive a signal from ambient environment through the second surface 103b or the sidewall 103c.

In some embodiments, the second molding 104 includes a recess 104b. In some embodiments, the second die 103 is disposed within the recess 104b and is contacted with a sidewall of the recess 104b. In some embodiments, a width W1 of the recess 104b is substantially same as a width W2 of the second die 103. In some embodiments, the second molding 104 can be a single layer film or a composite stack. In some embodiments, the second molding 104 includes various materials, such as molding compound, molding underfill, epoxy, resin, or the like. In some embodiments, the second molding 104 has a high thermal conductivity, a low moisture absorption rate and a high flexural strength.

In some embodiments, a first dielectric layer 105 is disposed over the first molding 102. In some embodiments, the first dielectric layer 105 is disposed between the first molding 102 and the second molding 103. In some embodiments, the first dielectric layer 105 is disposed between the first molding 102 and the second die 103. In some embodiments, the first surface 103a of the second die 103 faces the first dielectric layer 105. In some embodiments, the first surface 103a of the second die 103 is interfaces with the first dielectric layer 105. In some embodiments, the first dielectric layer 105 includes dielectric material such as silicon oxide, silicon nitride, silicon carbide, silicon oxynitride or the like.

In some embodiments, a first interconnect structure 106 is surrounded by or disposed within the first dielectric layer 105. In some embodiments, the first interconnect structure 106 is extended within the first dielectric layer 105 and between the second die 103 and the first molding 102. In some embodiments, a portion of the first interconnect structure 106 is coupled with the second conductive pad 103d, so that the second die 103 is electrically connected to the first die 101 through the first interconnect structure 106. In some embodiments, the portion of the first interconnect structure 106 is exposed from the first dielectric layer 105. In some embodiments, the second die 103 is disposed over a portion of the first interconnect structure 106 exposed from the first dielectric layer 105. In some embodiments, the first interconnect structure 106 includes conductive material such as gold, silver, copper, nickel, tungsten, aluminum, palladium and/or alloys thereof.

In some embodiments, a second dielectric layer 107 is disposed over the first molding 102 and the first die 101. In some embodiments, the second dielectric layer 107 is interfaced with the top surface 101a of the first die 101. In some embodiments, the second dielectric layer 107 includes dielectric material such as silicon oxide, silicon nitride, silicon carbide, silicon oxynitride or the like.

In some embodiments, a second interconnect structure 108 is surrounded by or disposed within the second dielectric layer 107. In some embodiments, the second interconnect structure 108 is extended within the second dielectric layer 107. In some embodiments, a portion of the second interconnect structure 108 is coupled with the first conductive pad 101d to electrically connect to the first die 101. In some embodiments, the portion of the second interconnect structure 108 is exposed from the second dielectric layer 107. In some embodiments, the second interconnect structure 108 includes conductive material such as gold, silver, copper, nickel, tungsten, aluminum, palladium and/or alloys thereof.

In some embodiments, a connector 109 is disposed below the second dielectric layer 107. In some embodiments, the connector 109 is electrically coupled with the second interconnect structure 108. In some embodiments, the connector 109 is disposed below or coupled with a portion of the second interconnect structure 108 exposed from the second dielectric layer 107. In some embodiments, a bump pad is disposed over the portion of the second interconnect structure 108, and the connector 109 is disposed over the bump pad. In some embodiments, the connector 109 is configured to electrically connect to a circuitry or a conductive structure. In some embodiments, the connector 109 includes conductive material such as includes solder, copper, nickel, gold or etc. In some embodiments, the connector 109 is a conductive bump, a solder ball, a ball grid array (BGA) ball, controlled collapse chip connection (C4) bump, microbump, a pillar, a post or the like. In some embodiments, the connector 109 is in a spherical, hemispherical or cylindrical shape.

In some embodiments, a conductive via 110 is surrounded by the first molding 102. In some embodiments, the conductive via 110 is extended through the first molding 102. In some embodiments, the conductive via 110 is a through integrated fan out via (TIV) extending through the first molding 102. In some embodiments, the conductive via 110 is electrically connected to the first interconnect structure 106 or the second interconnect structure 108. In some embodiments, the first die 101 is electrically connected to the second die 103 through the conductive via 110. In some embodiments, the conductive via 110 includes conductive material such as gold, silver, copper, nickel, tungsten, aluminum, tin and/or alloys thereof.

Figure 2:
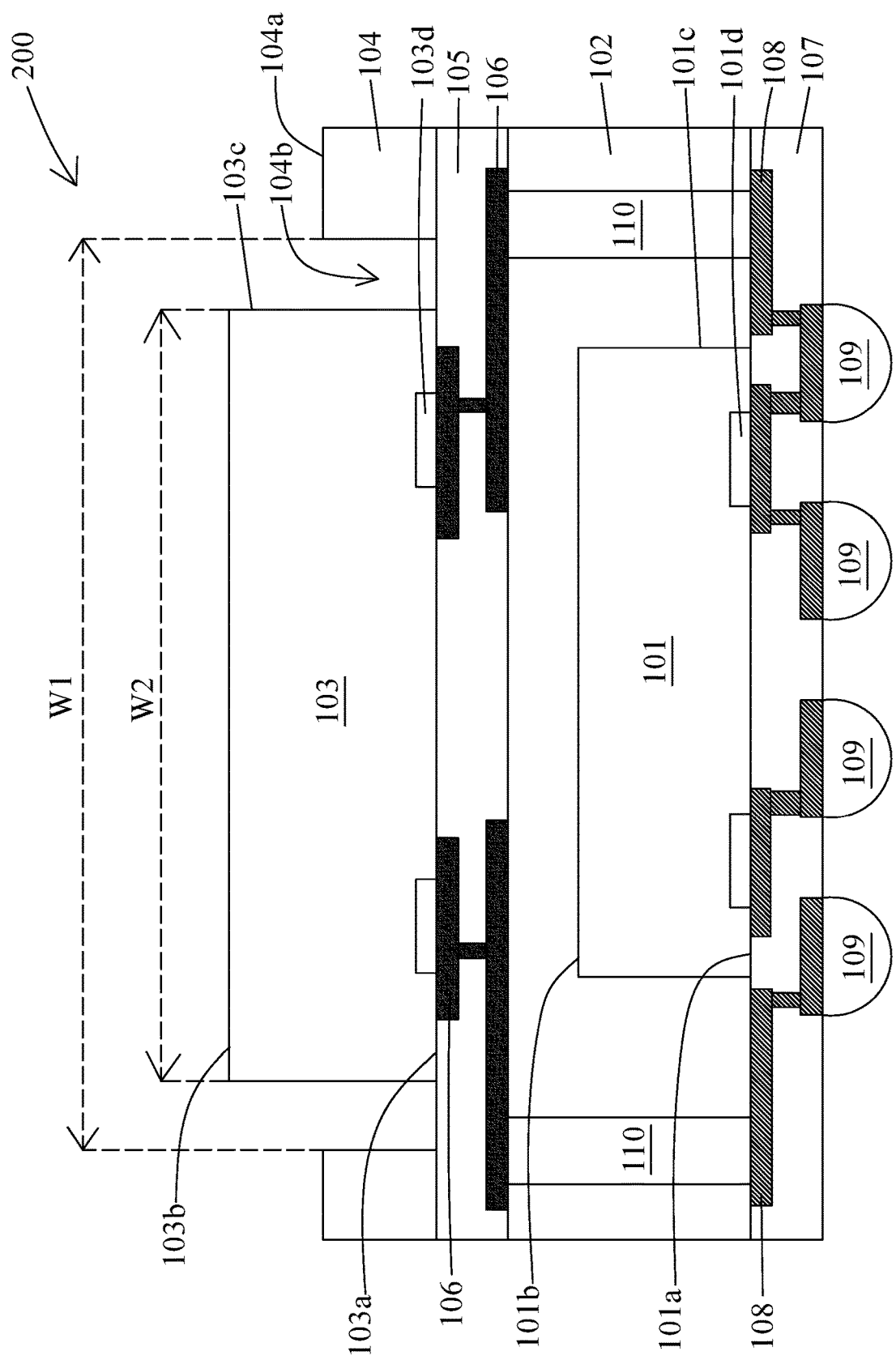
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes a first die 101, a first molding 102, a second die 103 and a second molding 104, which have similar configurations as described above or illustrated in FIG. 1.

In some embodiments, the second molding 104 includes a recess 104b extending through the second molding 104. In some embodiments, the second die 103 is disposed within the recess 104b. In some embodiments, there is a gap between the second die 103 and the second molding 104. In some embodiments, the second surface 103b and the sidewall 103c of the second die 103 are apart from the second molding 104. In some embodiments, the second surface 103b and the sidewall 103c of the second die 103 are entirely exposed from the second molding 104 and do not contact with the second molding 104.

In some embodiments, a width W1 of the recess 104b is substantially greater than a width W2 of the second die 103. In some embodiments, a first dielectric layer 105 is disposed between the first molding 102 and the second die 103, and a first interconnect structure 106 is disposed within the first dielectric layer 105, and the recess 104b is disposed over a portion of the first interconnect structure 106 exposed from the first dielectric layer 105. In some embodiments, such partial or entire exposure of the second die 103 allows the second die 103 performing sensing functions.

Figure 3:
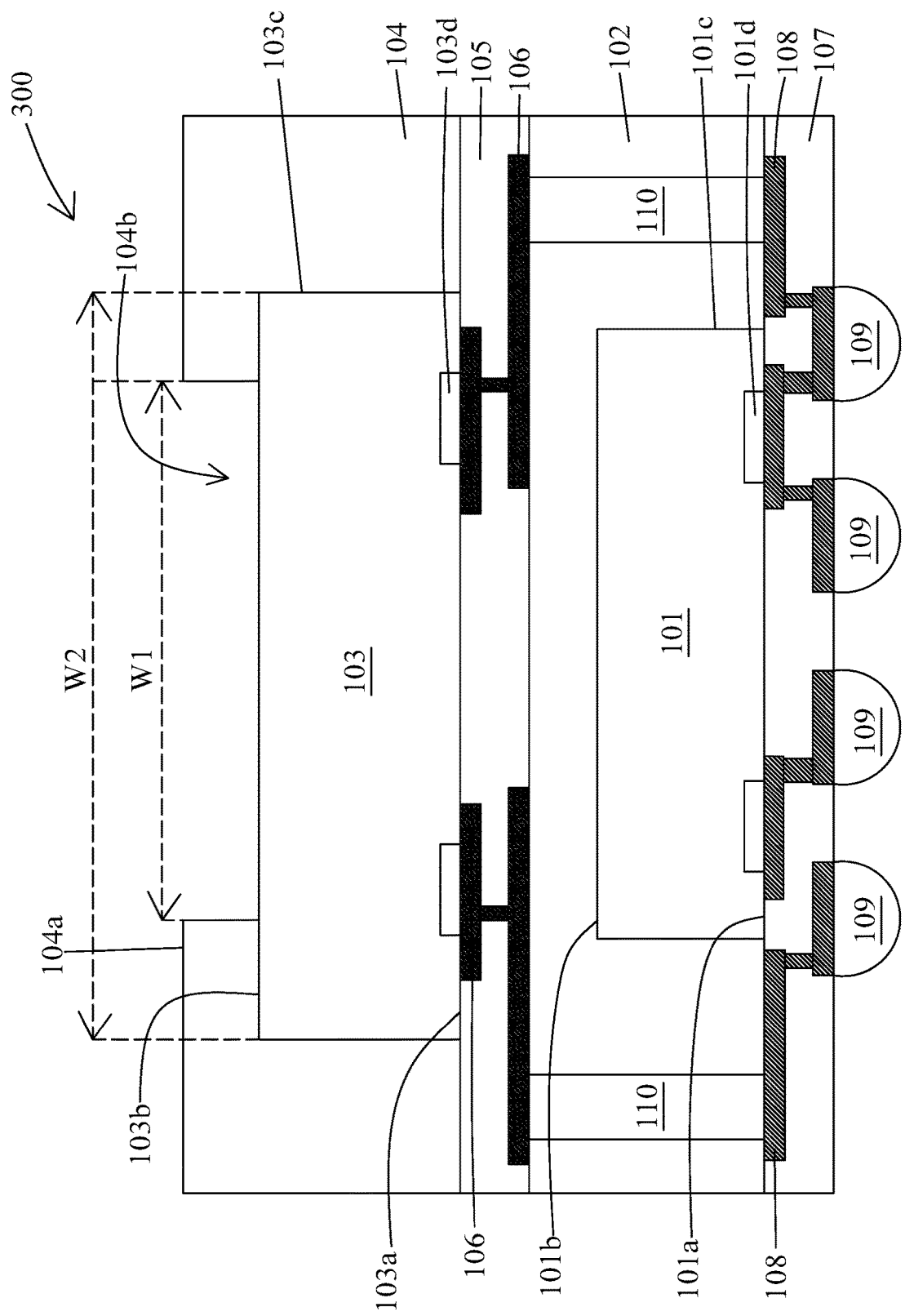
FIG. 3 is a schematic cross sectional view of a semiconductor structure in accordance with some embodiments of the present disclosure.

FIG. 3 is a schematic cross sectional view of a semiconductor structure 300 in accordance with various embodiments of the present disclosure. In some embodiments, the semiconductor structure 300 includes a first die 101, a first molding 102, a second die 103 and a second molding 104, which have similar configurations as described above or illustrated in FIG. 1 or 2.

In some embodiments, the second molding 104 includes a recess 104b disposed over the second die 103. In some embodiments, the second die 103 is partially covered by the second molding 104. In some embodiments, the recess 104a is disposed over the second surface 103b of the second die 103. In some embodiments, a level of a top surface 104a of the second molding 104 is substantially higher than a level of the second surface 103b of the second die 103. In some embodiments, a portion of the second surface 103b of the second die 103 is exposed from the second molding 104. In some embodiments, the sidewall 103c of the second die 103 is entirely interfaced with or in contact to the second molding 104. In some embodiments, a width W1 of the recess 104b is substantially less than a width W2 of the second die 103.

Figure 4:
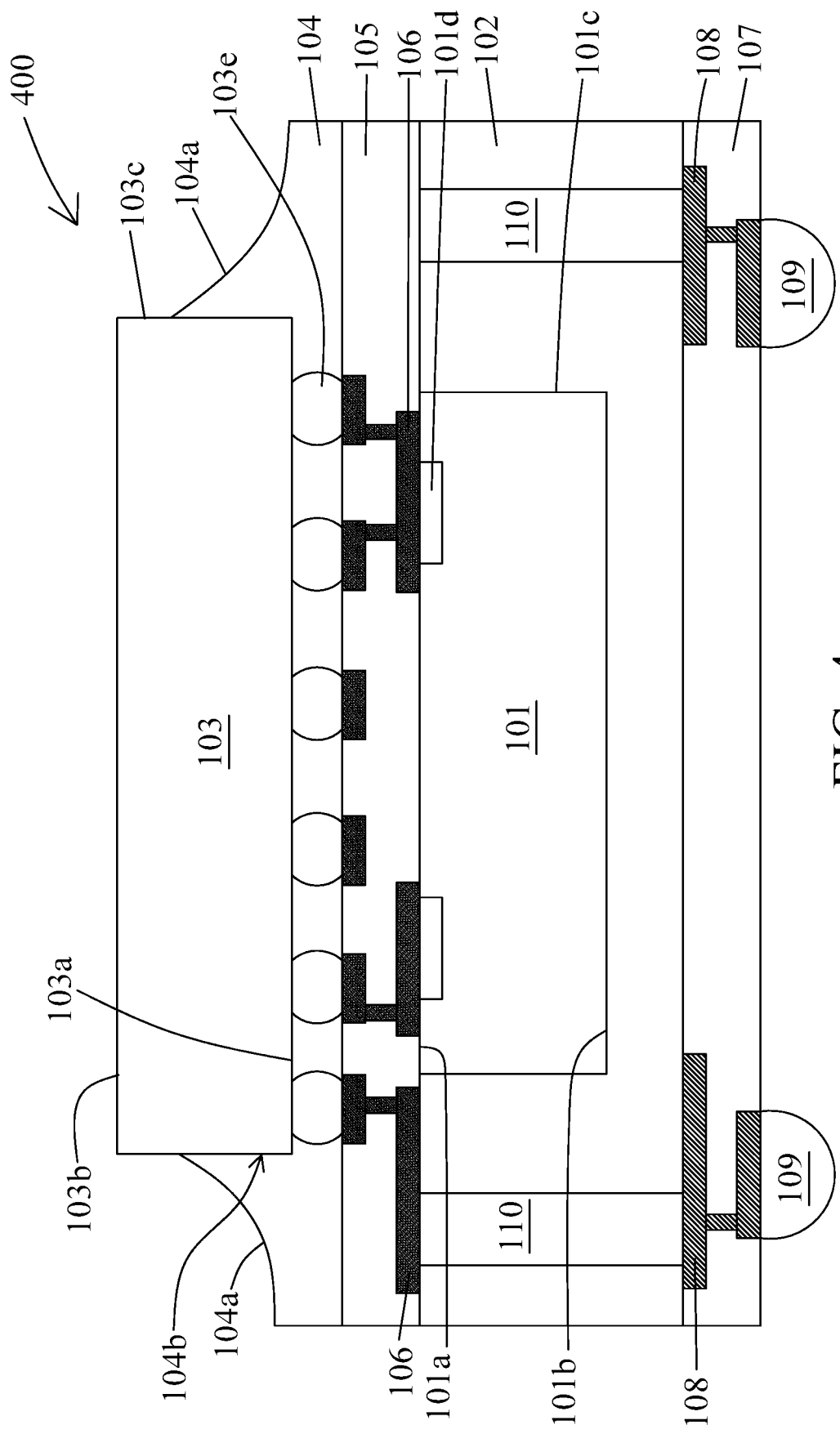
FIG. 4 is a schematic cross sectional view of a semiconductor structure in accordance with some embodiments of the present disclosure.
Figure 5:
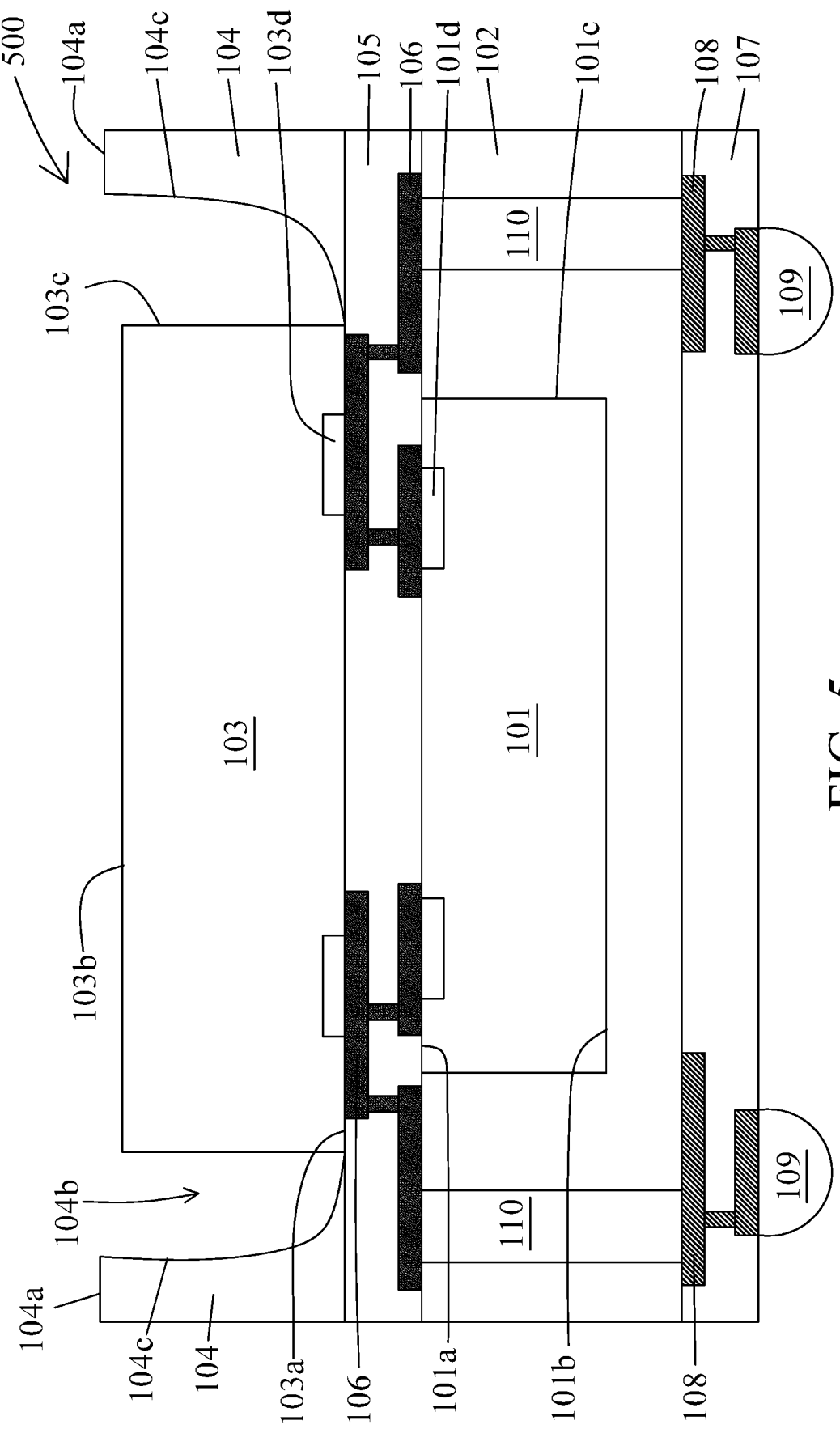
FIG. 5 is a schematic cross sectional view of a semiconductor structure in accordance with some embodiments of the present disclosure.
Figure 6:
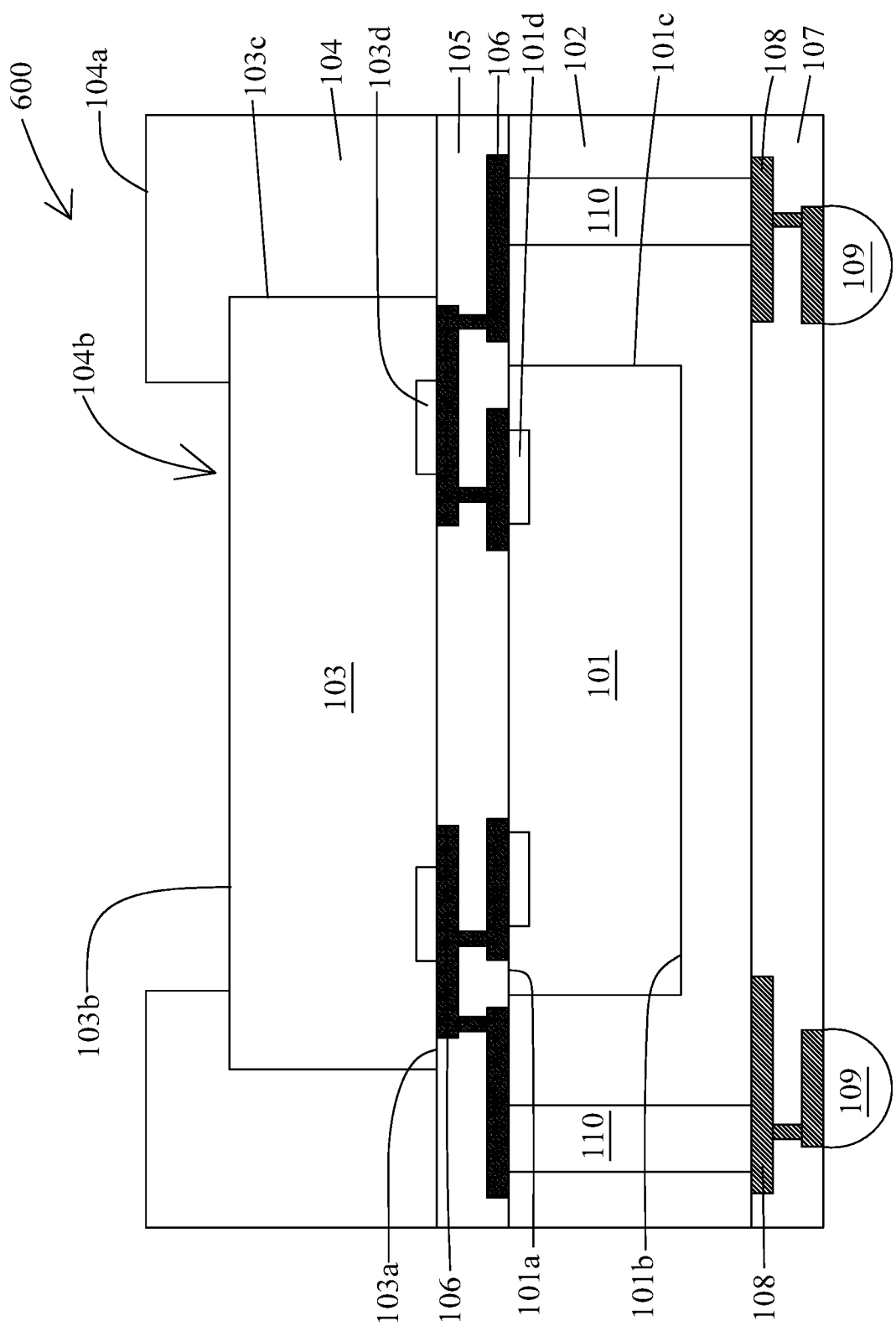
FIG. 6 is a schematic cross sectional view of a semiconductor structure in accordance with some embodiments of the present disclosure.

FIGS. 4-6 are schematic cross sectional views of semiconductor structures (400, 500 or 600) respectively in accordance with various embodiments of the present disclosure. In some embodiments, the semiconductor structures (400, 500 or 600) respectively include a first die 101, a first molding 102, a second die 103 and a second molding 104, which have similar configurations as described above or illustrated in FIGS. 1-3 respectively.

In some embodiments, the first die 101 is flipped, that a top surface 101a of the first die 101 faces the second die 103 while a bottom surface 101b of the first die 101 is disposed distal to the second die 103. In some embodiments, the bottom surface 101b and a sidewall 101c of the first die 101 are interfaced with the first molding 102, and the top surface 101a of the first die 101 is exposed from the first molding 102. In some embodiments, the top surface 101a of the first die 101 is interfaced with a first dielectric layer 105 disposed between the first die 101 and the second die 103. In some embodiments, the first conductive pad 101d of the first die 101 is electrically connected to a first interconnect structure 106 disposed within the first dielectric layer 105.

In some embodiments as shown in FIG. 4, the top surface 104a of the second molding 104 is a curved surface. In some embodiments, the top surface 104a is in convex configuration. In some embodiments, the second die 103 includes a conductive bump 103e disposed under the first surface 103a of the second die 103. In some embodiments, the conductive bump 103e is electrically connected to the first interconnect structure 106, such that the first die 101 is electrically connected to the second die 103 through the conductive bump 103e and the first interconnect structure 106. In some embodiments, some of the second molding 104 surround the conductive bump 103e and are disposed between the second die 103 and the first dielectric layer 105.

In some embodiments as shown in FIG. 5, the second die 103 is disposed within the recess 104b of the second molding 104. In some embodiments, a sidewall 104c of the recess 104b is a curved surface. In some embodiments, the sidewall 104c is curved away from the second die 103. In some embodiments, the sidewall 104c is in a convex configuration.

FIGS. 7-10 are schematic cross sectional views of semiconductor structures (700, 800, 900 and 1000) respectively in accordance with various embodiments of the present disclosure. In some embodiments, the semiconductor structures (700, 800, 900 and 1000) respectively include a first die 101, a first molding 102, a second die 103 and a second molding 104, which have similar configurations as described above or illustrated in FIGS. 1-3 respectively.

Figure 7:
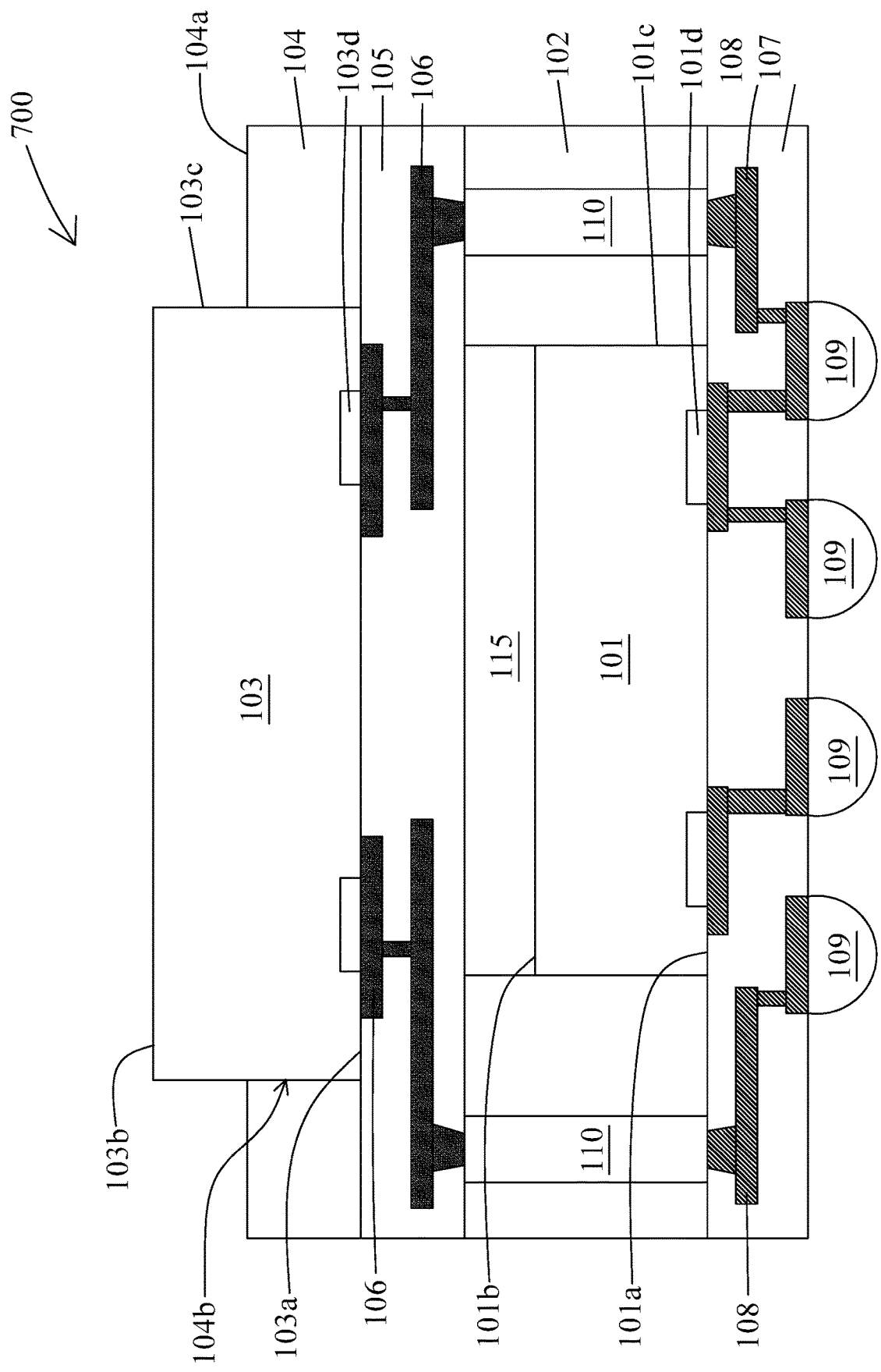
FIG. 7 is a schematic cross sectional view of a semiconductor structure in accordance with some embodiments of the present disclosure.
Figure 8:
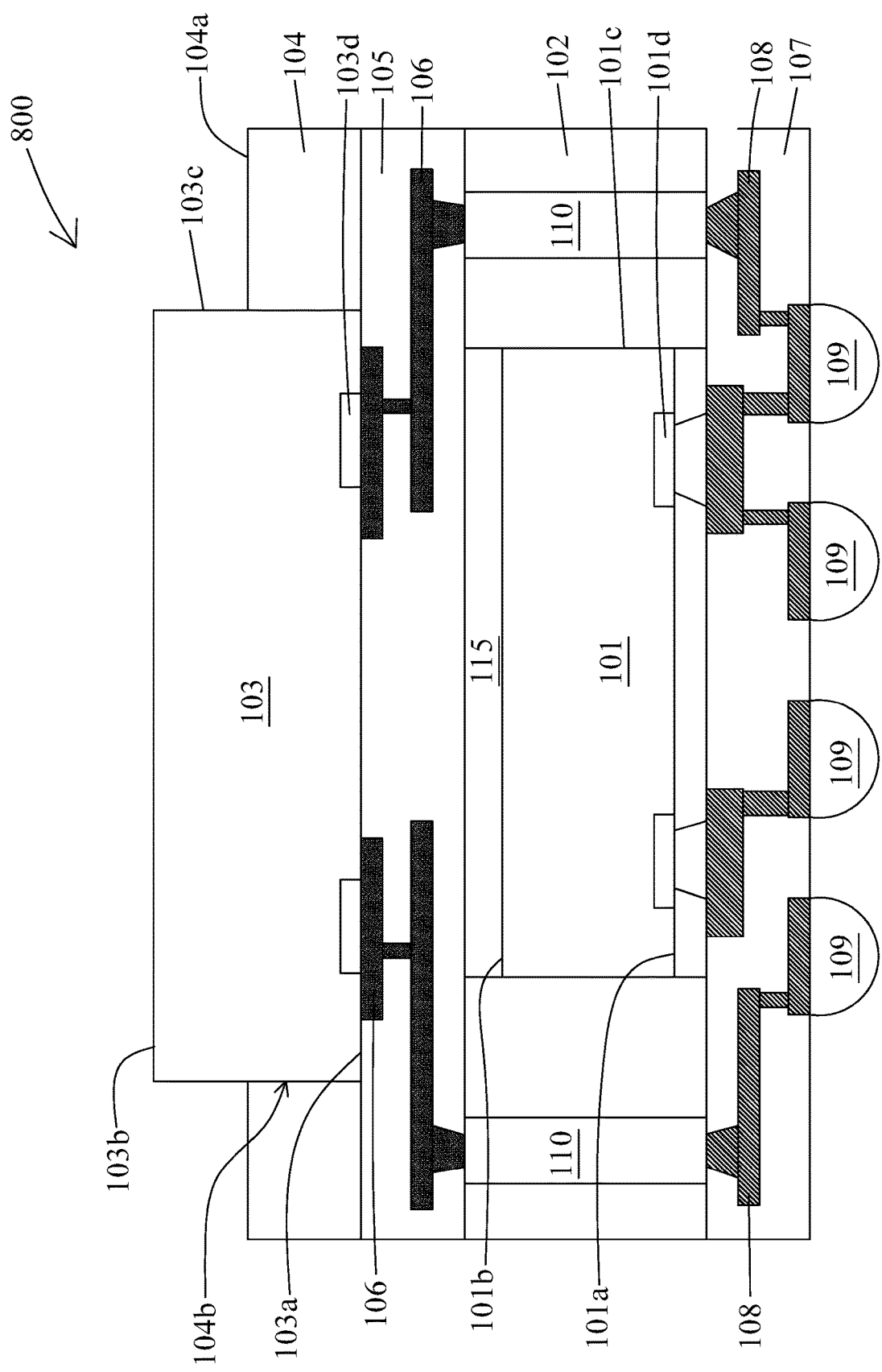
FIG. 8 is a schematic cross sectional view of a semiconductor structure in accordance with some embodiments of the present disclosure.

In some embodiments as shown in FIGS. 7 and 8, the semiconductor structures (700 and 800) respectively include an adhesive 115 disposed between the first dielectric layer 105 and the first die 101. In some embodiments, the adhesive 115 includes glue, a die attach film (DAF), etc. In some embodiments, the adhesive 115 is surrounded by the first molding 102. In some embodiments, the adhesive 115 is disposed over the bottom surface 101b of the first die 101.

Figure 9:
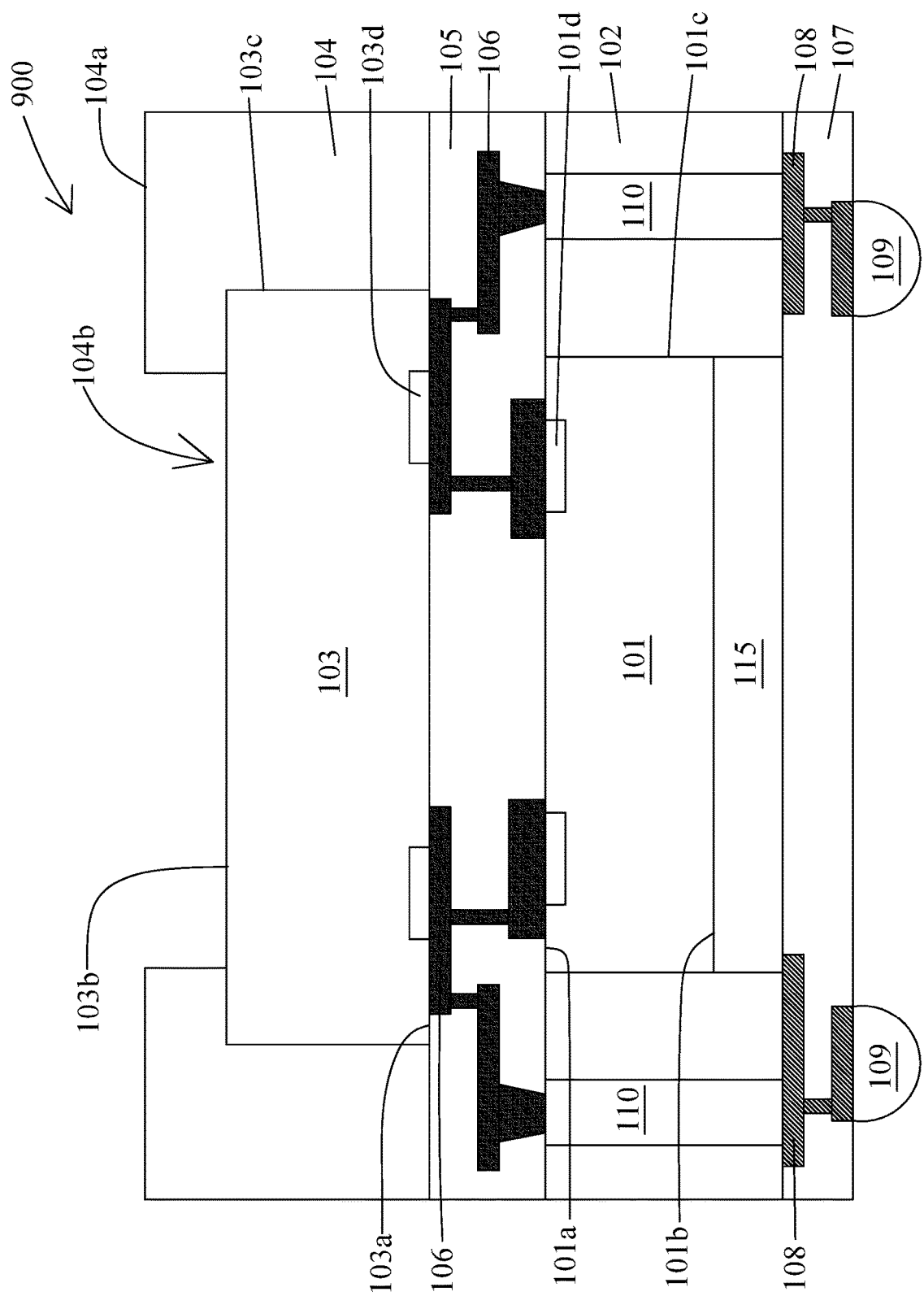
FIG. 9 is a schematic cross sectional view of a semiconductor structure in accordance with some embodiments of the present disclosure.
Figure 10:
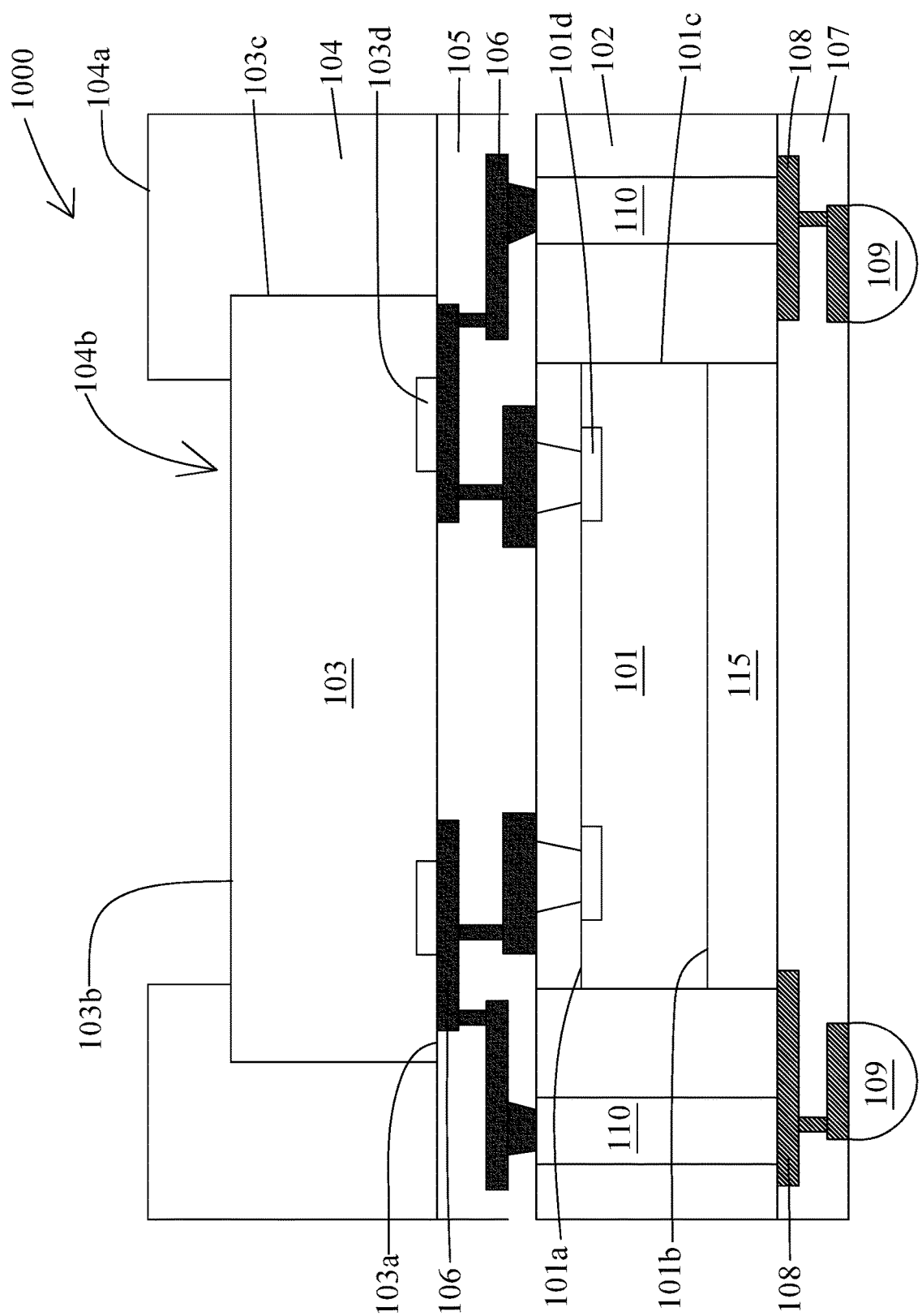
FIG. 10 is a schematic cross sectional view of a semiconductor structure in accordance with some embodiments of the present disclosure.

In some embodiments as shown in FIGS. 9 and 10, the semiconductor structures (900 and 1000) respectively include the adhesive 115 disposed between the second dielectric layer 107 and the first die 101. In some embodiments, the adhesive 115 is surrounded by the first molding 102. In some embodiments, the adhesive 115 is disposed over the bottom surface 101b of the first die 101.

Figure 11:
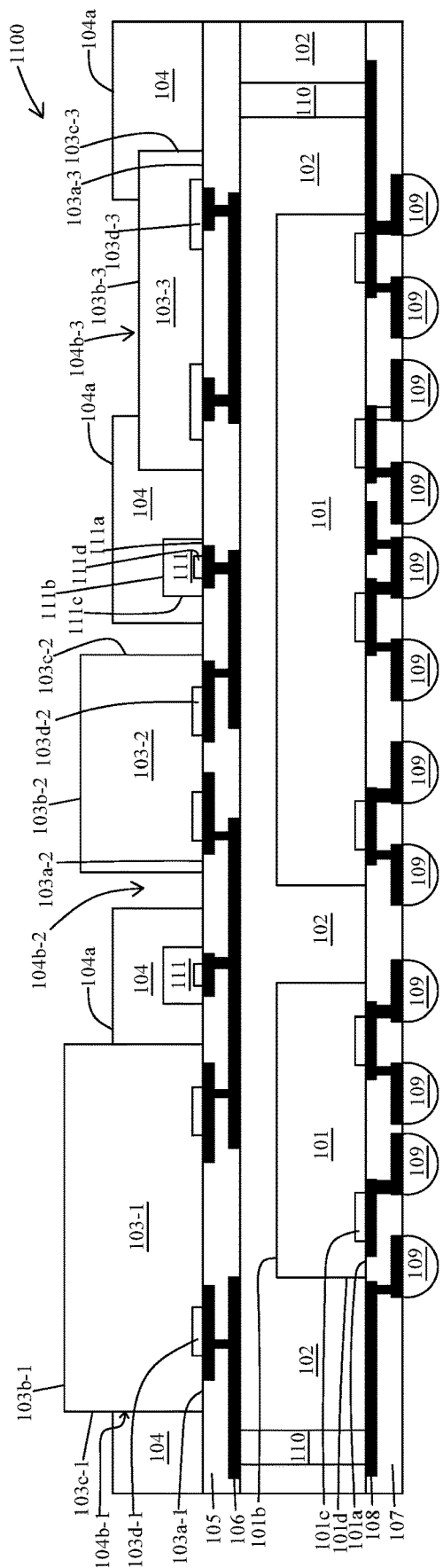
FIG. 11 is a schematic cross sectional view of a semiconductor structure in accordance with some embodiments of the present disclosure.

FIG. 11 is a schematic cross sectional view of a semiconductor structure 1100 in accordance with various embodiments of the present disclosure. In some embodiments, the semiconductor structure 1100 is combination of the semiconductor structures (100, 200 or 300). In some embodiments, the semiconductor structure 1100 includes a first die 101 and a first molding 102, which have similar configurations as described above or illustrated in any one of FIGS. 1-10. In some embodiments, the semiconductor structure 1100 includes second dies (103-1, 103-2, 103-3) which are in similar configuration as the second die 103 illustrated in FIGS. 1-3 respectively. In some embodiments, the semiconductor structure 700 includes a second molding 104 which is in similar configuration as the second molding 104 illustrated in FIGS. 1-3 respectively. In some embodiments, the second molding 104 includes recesses (104b-1, 104b-2, 104b-3) which are in similar configuration as the recess 104b illustrated in FIGS. 1-3 respectively.

In some embodiments, the semiconductor structure 1100 includes a third die 111 encapsulated by the second molding 104. In some embodiments, the third die 111 is a die, a chip or a package. In some embodiments, the third die 111 is disposed adjacent to the second die (103-1, 103-2 or 103-3). In some embodiments, the third die 111 is disposed between two of the second dies (103-1, 103-2 or 103-3). In some embodiments, a thickness of the third die 111 is substantially less than a thickness of the second die (103-1, 103-2 or 103-3). In some embodiments, the third die 111 includes a top surface 111a, a bottom surface 111b opposite to the top surface 111a, a sidewall 111c between the top surface 111a and the bottom surface 111b, and a third conductive pad 111d disposed over the top surface 111a. In some embodiments, a top surface 104a of the second molding 104 is at a level substantially higher than a level of the bottom surface 111b of the third die 111. In some embodiments, the bottom surface 111b and the sidewall 111c of the third die 111 are contacted with the second molding 104.

Figure 12:
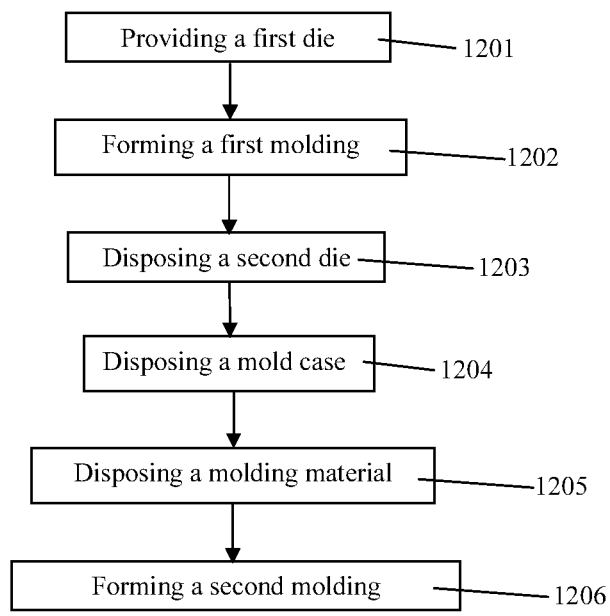
FIG. 12 is a flow diagram of a method of manufacturing a semiconductor structure in accordance with some embodiments of the present disclosure.

In the present disclosure, a method of manufacturing a semiconductor structure (100, 200, 300, 400, 500, 600, 700, 800, 900, 1000 or 1100) is also disclosed. In some embodiments, a semiconductor structure (100, 200, 300, 400, 500, 600, 700, 800, 900, 1000 or 1100) is formed by a method 1200. The method 1200 includes a number of operations and the description and illustration are not deemed as a limitation as the sequence of the operations. FIG. 12 is an embodiment of the method 1200 of manufacturing the semiconductor structure (100, 200, 300, 400, 500, 600, 700, 800, 900, 1000 or 1100). The method 1200 includes a number of operations (1201, 1202, 1203, 1204, 1205 and 1206).

Figure 12A:
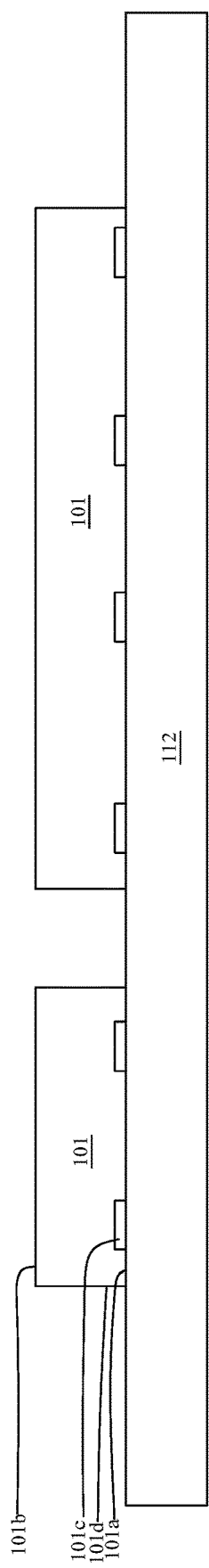

In operation 1201, a first die 101 is provided or received as shown in FIG. 12A. In some embodiments, the first die 101 is a die, a chip or a package. In some embodiments, the first die 101 comprises a variety of electrical circuits suitable for a particular application. In some embodiments, the first die 101 has similar configuration as described above or illustrated in any one of FIGS. 1-11. In some embodiments, a carrier 112 is provided for temporarily supporting the first die 101 and other components subsequently disposed thereon. In some embodiments, the carrier 112 is a substrate or a wafer. In some embodiments, the carrier 112 includes silicon, glass, ceramic or the like. In some embodiments, a top surface 101a of the first die 101 is disposed over the carrier 112.

Figure 12B:
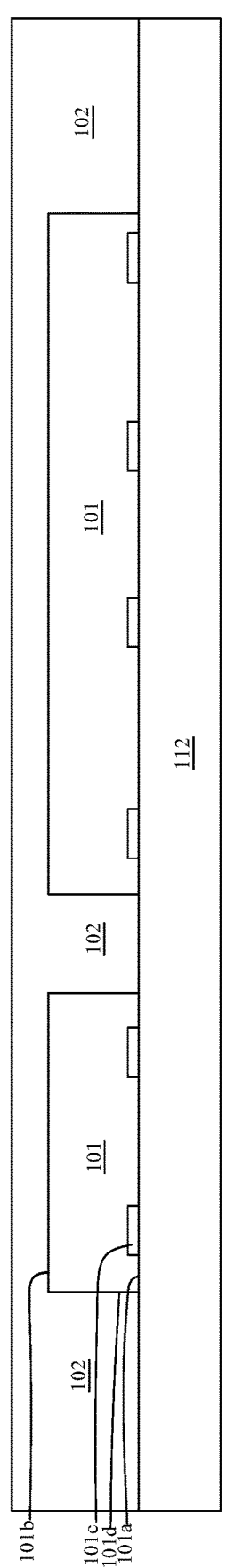

In operation 1202, a first molding 102 is formed as shown in FIG. 12B. In some embodiments, the first molding 102 encapsulates the first die 101. In some embodiments, the bottom surface 101b and the sidewall 101c of the first die 101 are contacted with the first molding 102. In some embodiments, the first molding 102 is formed by transfer molding, injection molding or any other suitable operations. In some embodiments, the first molding 102 has similar configuration as described above or illustrated in any one of FIGS. 1-11.

Figure 12C:
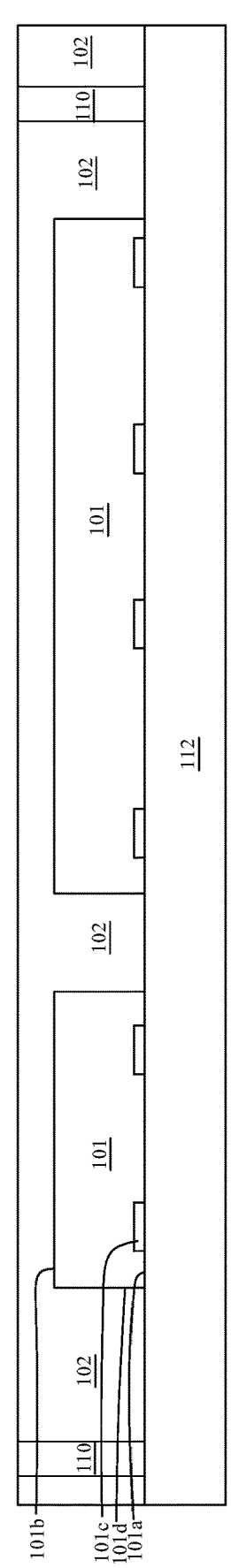

In some embodiments as shown in FIG. 12C, a conductive via 110 is surrounded by the first molding 102. In some embodiments, the conductive via 110 extends through the first molding 102. In some embodiments, the conductive via 110 is formed by removing a portion of the first molding 102 to form an opening and disposing a conductive material into the opening. In some embodiments, the conductive material is disposed by electroplating, electroless plating or other suitable operations. In some embodiments, the opening is formed by photolithography and etching operations. In some embodiments, a portion of the conductive via 110 is exposed from the first molding 102. In some embodiments, the conductive via 110 has similar configuration as described above or illustrated in any one of FIGS. 1-11.

In some embodiments as shown in FIG. 12D, a first dielectric layer 105 and a first interconnect structure 106 are formed over the first molding 102. In some embodiments, the first dielectric layer 105 is disposed over the first molding 102 by spin coating, chemical vapor deposition (CVD) or any other suitable operations. In some embodiments, the first interconnect structure 106 is disposed within the first dielectric layer 105. In some embodiments, the first dielectric layer 105 is patterned by photolithography and etching operations. In some embodiments, the first interconnect structure 106 is formed by removing a portion of the first dielectric layer 105 and then disposing a conductive material. In some embodiments, the conductive material is disposed by electroplating, electroless plating or other suitable operations. In some embodiments, the first interconnect structure 106 is electrically connected to the conductive via 110. In some embodiments, a portion of the first interconnect structure 106 is exposed from the first dielectric layer 105. In some embodiments, the first dielectric layer 105 and the first interconnect structure 106 have similar configurations as described above or illustrated in any one of FIGS. 1-11.

In operation 1203, a second die (103-1, 103-3) is disposed over the first molding 102 as shown in FIG. 12E. In some embodiments, the second die (103-1, 103-3) is mounted over the first molding 102. In some embodiments, the second die (103-1, 103-3) is disposed over the portion of the first interconnect structure 106 exposed from the first dielectric layer 105 to electrically connect with the first interconnect structure 106 or the first die 101. In some embodiments, a first surface (103a-1, 103a-3) of the second die (103-1, 103-3) is disposed over the first dielectric layer 105. In some embodiments, a second conductive pad (103d-1, 103d-3) of the second die (103-1, 103-3) is disposed over and electrically connected to the first interconnect structure 106. In some embodiments, the second die (103-1, 103-3) has similar configuration as described above or illustrated in any one of FIGS. 1-11.

In some embodiments, a third die 111 is disposed over the first molding 102 as shown in FIG. 12E. In some embodiments, the third die 111 is mounted over the first molding 102. In some embodiments, the third die 111 is disposed over the portion of the first interconnect structure 106 exposed from the first dielectric layer 105 to electrically connect with the first interconnect structure 106 or the first die 101. In some embodiments, a third conductive pad 111d of the third die 111 is disposed over and electrically connected to the first interconnect structure 106. In some embodiments, the third die 111 has similar configuration as described above or illustrated in FIG. 11.

Figure 12F:
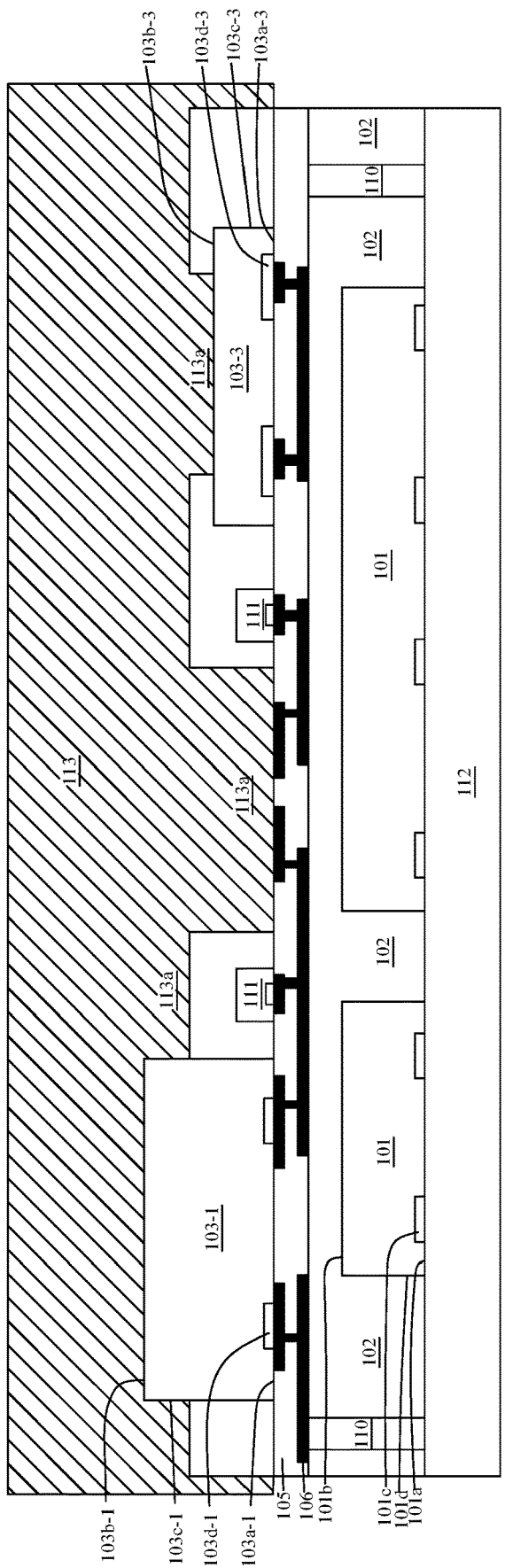

In operation 1204, a mold chase 113 is disposed over the second die (103-1, 103-3), the first molding 102 and the third die 111 as shown in FIG. 12F. In some embodiments, the mold chase 113 is configured for forming a molding. In some embodiments, the mold chase 113 is in a predetermined shape or configuration. In some embodiments, the mold chase 113 includes a protrusion 113a protruded from the mold chase towards the first molding 102. In some embodiments, the protrusion 113a is disposed over the second die 103-3 or adjacent to the second die 103-1. In some embodiments, the protrusion 113a is disposed over or is contacted with the first dielectric layer 105 or the first interconnect structure 106. In some embodiments, the mold chase 113 includes steel or the like. In some embodiments, a release film is disposed over a surface of the mold chase 113 facing to the first molding 102 and the second die (103-1, 103-3).

Figure 12G:
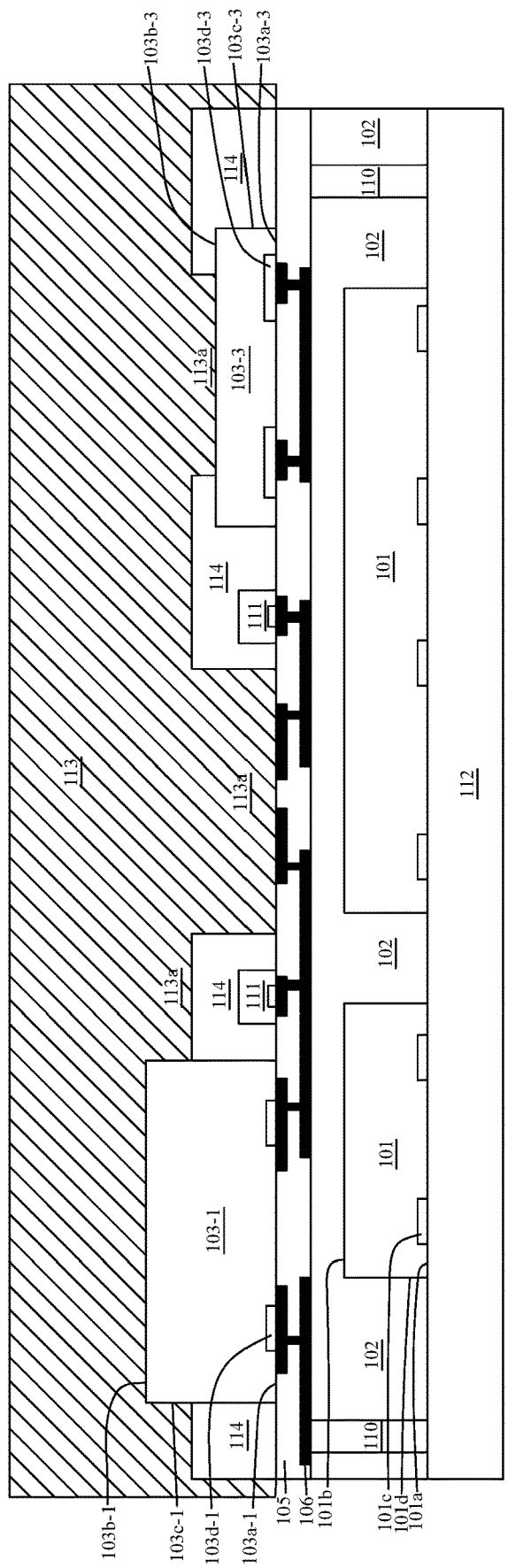

In operation 1205, a molding material 114 is disposed between the mold chase 113 and the first molding 102 as shown in FIG. 12G. In some embodiments, a space defined by the mold chase 113, the second die (103-1, 103-3) and the first dielectric layer 105 is filled by the molding material 114. In some embodiments, the molding material 114 surrounds the protrusion 113a. In some embodiments, the molding material 114 includes molding compound, molding underfill, epoxy, resin, or the like.

Figure 12H:
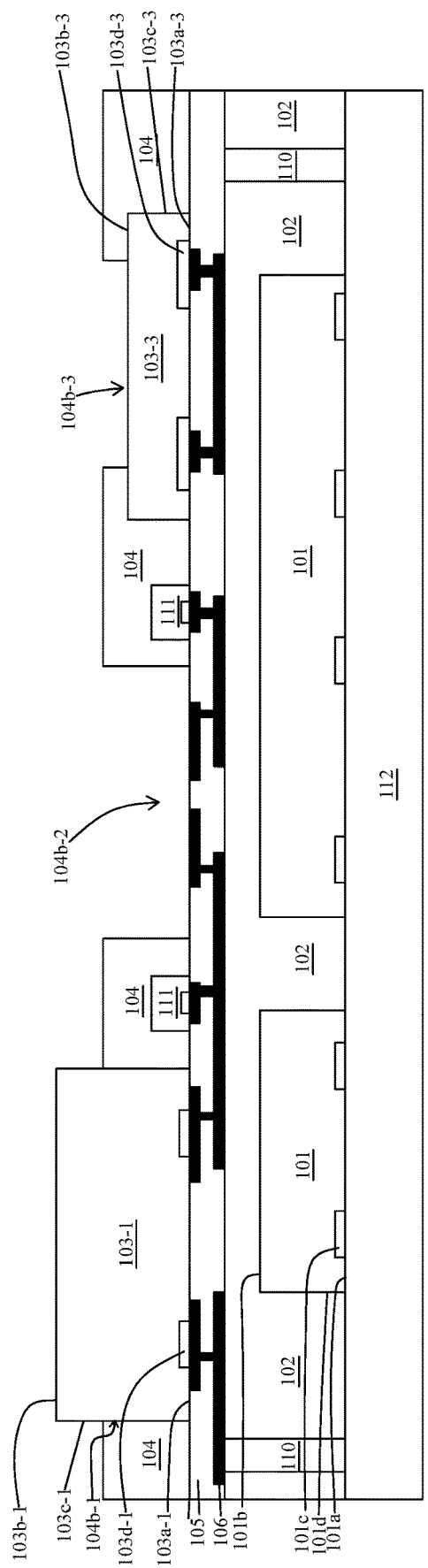

In operation 1206, a second molding 104 is formed as shown in FIG. 12H. In some embodiments, the second molding 104 is formed after curing the molding material 114. In some embodiments, the mold chase 113 is removed after the formation of the second molding 104. In some embodiments, the second die (103-1, 103-3) is surrounded by the second molding 104. In some embodiments, the third die 111 is encapsulated by the second molding 104. In some embodiments, the second die (103-1, 103-3) is at least partially exposed from the second molding 104. In some embodiments, the second molding 104 is formed by transfer molding, compression molding, print molding or any other suitable operations.

In some embodiments, the second molding 104 includes a recess (104b-1, 104b-2, 104b-3). In some embodiments, a sidewall of the recess (104b-1, 104b-2, 104b-3) is conformal to an outer surface of the protrusion 113a of the mold chase 113. In some embodiments, the recess 104b-1 surrounds the second die 103-1. In some embodiments, the recess 104b-2 extends through the second molding 104. In some embodiments, the recess 104b-3 is disposed over the second die 103-3.

In some embodiments, the second molding 104 is formed by disposing the molding material 114 over the second die (103-1, 103-3), the third die 111 and the first dielectric layer 105, and inserting the protrusion 113a of the mold chase 113 into the molding material 114. In some embodiments, the recess (104b-1, 104b-2, 104b-3) is formed and the sidewall of the recess (104b-1, 104b-2, 104b-3) is conformal to the outer surface of the protrusion 113a of the mold chase 113 after the insertion of the protrusion 113a.

Figure 12I:
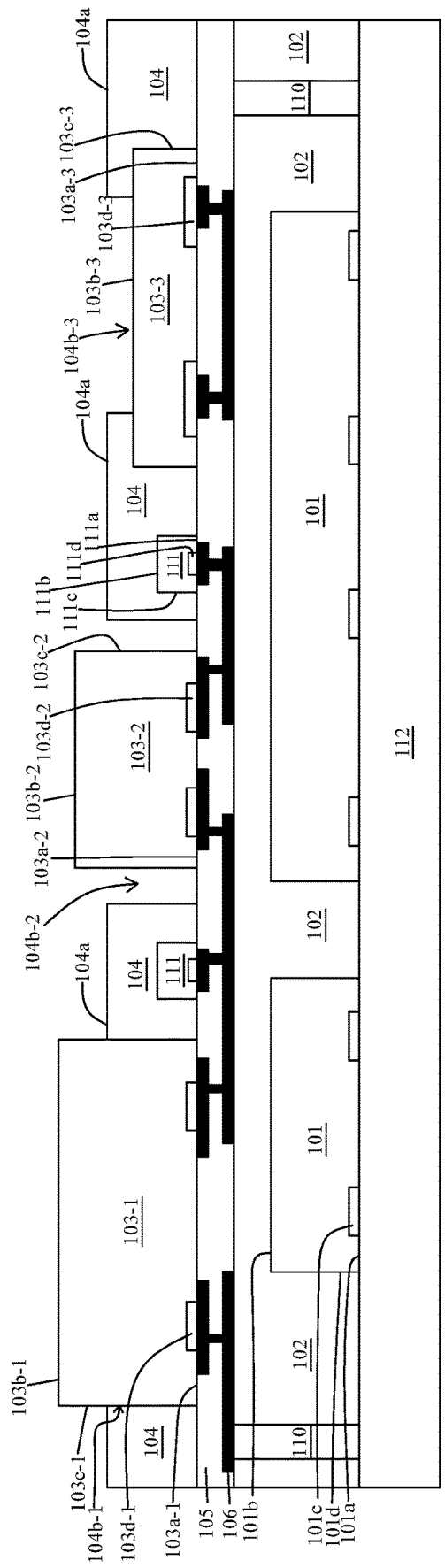

In some embodiments as shown in FIG. 12I, another second die 103-2 is disposed within the recess 104b-2. In some embodiments, there is a gap between the second die 103-2 and the second molding 104. In some embodiments, the second surface 103b-2 and the sidewall 103c-2 of the second die 103-2 are apart from the second molding 104. In some embodiments, the second surface 103b-2 and the sidewall 103c-2 of the second die 103-2 are entirely exposed from the second molding 104 and do not contact with the second molding 104. In some embodiments, the second die 103-2 is electrically connected to the first die 101 through the first interconnect structure 106. In some embodiments, the second molding 104 has similar configuration as described above or illustrated in any one of FIGS. 1-11.

Figure 12J:
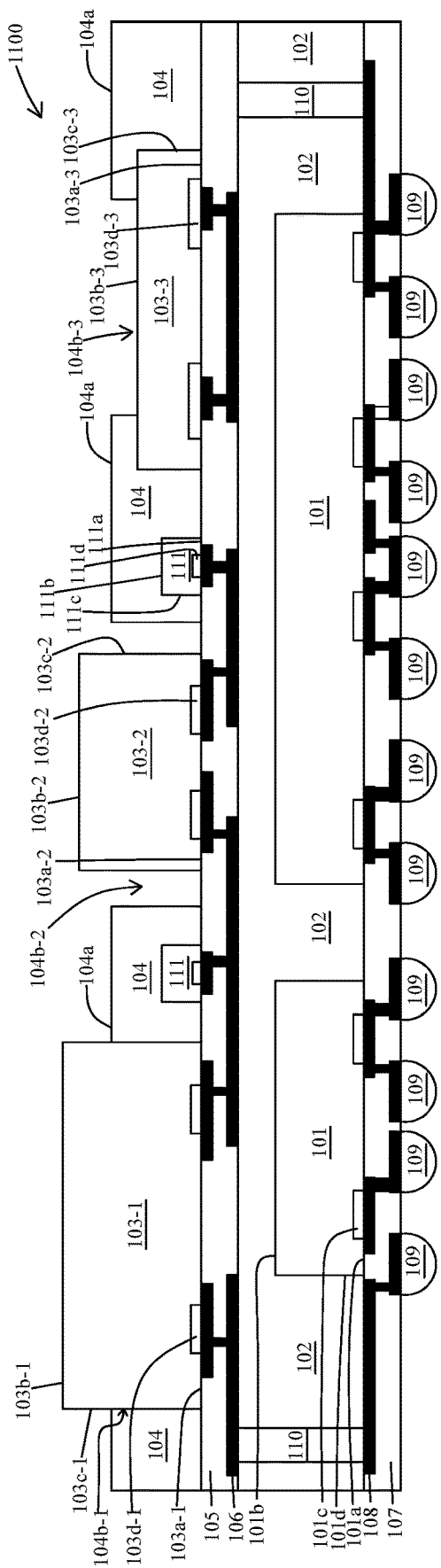

In some embodiments as shown in FIG. 12J, the carrier 112 is removed, and a second dielectric layer 107 and a second interconnect structure 108 are formed over the first molding 102 and the top surface 101a of the first die 101. In some embodiments, the second dielectric layer 107 is disposed by spin coating, chemical vapor deposition (CVD) or any other suitable operations. In some embodiments, the second interconnect structure 108 is disposed within the second dielectric layer 107. In some embodiments, the second dielectric layer 107 is patterned by photolithography and etching operations.

In some embodiments, the second interconnect structure 108 is formed by removing a portion of the second dielectric layer 107 and then disposing a conductive material. In some embodiments, the conductive material is disposed by electroplating, electroless plating or other suitable operations. In some embodiments, the second interconnect structure 108 is electrically connected to the conductive via 110. In some embodiments, a portion of the second interconnect structure 108 is exposed from the second dielectric layer 107. In some embodiments, the second dielectric layer 107 and the second interconnect structure 108 have similar configurations as described above or illustrated in any one of FIGS. 1-11.

In some embodiments as shown in FIG. 12J, a connector 109 is disposed under a portion of the second interconnect structure 108 to electrically connect to the second interconnect structure 108. In some embodiments, the connector 109 is disposed by ball dropping, solder pasting, stencil printing or other suitable operations. In some embodiments, the connector 109 has similar configuration as described above or illustrated in any one of FIGS. 1-11. In some embodiments, a semiconductor structure 1100 is formed. In some embodiments, the semiconductor structure 700 has similar configuration as the semiconductor structure 700 illustrated in FIG. 11.

In the present disclosure, a semiconductor structure with improvement is disclosed. The semiconductor structure includes a die or a package at least partially exposed from a molding. A predetermined portion of a surface of the die or a predetermined surface of the die is exposed from the molding. The die with exposed portion or exposed surface facilitates predetermined sensing function.

In some embodiments, a semiconductor structure includes a first die; a first molding encapsulating the first die; a second die disposed over the first molding, and including a first surface, a second surface opposite to the first surface, and a sidewall between the first surface and the second surface; and a second molding disposed over the first molding and surrounding the second die, wherein the first surface of the second die faces the first molding, and the second die is at least partially covered by the second molding.

In some embodiments, the second surface or the sidewall of the second die is partially or entirely covered by the second molding. In some embodiments, the second surface of the second die is at a level higher than a level of a top surface of the second molding. In some embodiments, the second surface of the second die is partially covered by the second molding, or the second molding includes a recess disposed over the second surface of the second die. In some embodiments, the second surface of the second die is at a level lower than a level of a top surface of the second molding. In some embodiments, the semiconductor structure further includes a third die disposed adjacent to the second die and encapsulated by the second molding.

In some embodiments, the semiconductor structure further includes a third die disposed adjacent to the second die and at least partially covered by the second molding. In some embodiments, a thickness of the third die is less than a thickness of the second die. In some embodiments, a top surface of the second molding is at a level higher than a level of a surface of the third die. In some embodiments, the semiconductor structure further includes a dielectric layer disposed between the first molding and the second die, and an interconnect structure disposed within the dielectric layer to electrically connect the second die with the first die. In some embodiments, the semiconductor structure further includes a conductive via extending through the second molding.

In some embodiments, a semiconductor structure includes a first die; a first molding encapsulating the first die; a second die disposed over the first molding and including a first surface, a second surface opposite to the first surface, and a sidewall between the first surface and the second surface; and a second molding disposed over the first molding and surrounding the second die, wherein the first surface faces the first molding, the second molding includes a recess, the second die is disposed within the recess, and the second surface and the sidewall of the second die are apart from the second molding.

In some embodiments, the second surface and the sidewall of the second die are entirely exposed. In some embodiments, a width of the recess is greater than a width of the second die. In some embodiments, the semiconductor structure further includes a dielectric layer disposed between the first molding and the second die and an interconnect structure disposed within the dielectric layer, the recess being disposed over a portion of the interconnect structure. In some embodiments, the second die is disposed over the portion of the interconnect structure.

In some embodiments, a method of manufacturing a semiconductor structure includes providing a first die; forming a first molding to encapsulate the first die; disposing a second die over the first molding; disposing a mold chase over the second die and the first molding, wherein the mold chase includes a protrusion protruded from the mold chase towards the first molding; disposing a molding material between the mold chase and the first molding; and forming a second molding to surround the second die, wherein the second die is at least partially covered by the second molding, and the disposing the molding material includes surrounding the protrusion of the mold chase by the molding material.

In some embodiments, the method further includes forming a recess extended through the second molding; disposing a third die within the recess; inserting the protrusion of the mold chase into the molding material; disposing the protrusion of the mold chase over a surface of the second die; disposing a dielectric layer between the second die and the first molding; forming an interconnect structure within the dielectric layer; disposing the protrusion over a portion of the interconnect structure and a portion of the dielectric layer; and removing the mold chase; or disposing a release film over a surface of the mold chase facing to the first molding and the second die.

In some embodiments, a sidewall of the recess of the second molding is conformal to an outer surface of the protrusion of the mold chase. In some embodiments, the second molding is formed by transfer molding, compression molding or print molding operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
    a first die including a first surface and a second surface opposite to the first surface;
    a first molding encapsulating the first die;
    a second die disposed over the first molding, and including a third surface, a fourth surface opposite to the third surface, and a sidewall between the third surface and the fourth surface;
    a third die disposed over the first molding, and including a fifth surface and a sixth surface opposite to the fifth surface, and a sidewall between the fifth surface and the sixth surface;
    a fourth die disposed over the first molding, and including a seventh surface and a eight surface opposite to the seventh surface, and a plurality of sidewalls between the seventh surface and the eight surface;
    a second molding disposed over the first molding and surrounding the second die, the third die and the fourth die; and
    a dielectric layer disposed between the first molding and the second molding, wherein
    the second surface of the first die faces the second die and is entirely in contact with the first molding, the third surface of the second die faces the first molding, the fourth surface of the second die is entirely exposed through the second molding, the sidewall of the second die is partially exposed through the second molding, the fifth surface of the third die faces the first molding, the sixth surface of the third die is partially exposed through the second molding and partially covered by the second molding, the plurality of sidewalls of the fourth die is entirely exposed through the second molding and a level of a top surface of the second molding is between a level of the sixth surface and a level of the eighth surface, wherein a bottom surface of the second molding, the third surface, the fifth surface and the seventh surface are coplanar, and
    the second molding is in contact with the sidewall of the second die and the third die; and
    the first molding and the second molding are separated from each other by the dielectric layer.

2. The semiconductor structure of claim 1, wherein the sidewall of the second die is partially covered by the second molding.

3. The semiconductor structure of claim 1, wherein the fourth surface of the second die is at a level higher than the level of the top surface of the second molding.

4. The semiconductor structure of claim 1, wherein the top surface of the second molding is at a level higher than the level of the sixth surface of the third die.

5. The semiconductor structure of claim 1, wherein the dielectric layer is disposed between the first molding and the second die, and an interconnect structure is disposed within the dielectric layer to electrically connect the second die with the first die.

6. The semiconductor structure of claim 1, further comprising a conductive via extending through the first molding.

7. A semiconductor structure, comprising:
    a first die including a first surface, a second surface opposite to the first surface, and a first sidewall between the first surface and the second surface;
    a first molding encapsulating the first die;

a second die disposed over the first molding and including a third surface, a fourth surface opposite to the third surface, and a second sidewall between the third surface and the fourth surface;

a third die disposed over the first molding, and including a fifth surface and a sixth surface opposite to the fifth surface, and a third sidewall between the fifth surface and the sixth surface;

a fourth die disposed over the first molding, and including a seventh surface and a eight surface opposite to the seventh surface, and a fourth sidewall between the seventh surface and the eight surface;

a second molding disposed over the first molding and surrounding the second die, the third die and the fourth die; and a dielectric layer disposed between the first molding and the second molding, wherein the third surface faces the first molding, the second molding includes a recess having curved side surfaces, the second die is disposed within the recess, the fourth surface and the second sidewall of the second die are entirely exposed through the second molding, the fourth surface of the second die is at a level different from a level of a top surface of the second molding, the first sidewall of the first die is entirely in contact with the first molding, the fifth surface faces the first molding, the second molding covers a portion of the sixth surface and exposes a portion of the sixth surface, the level of the top surface of the second molding is between a level of the eight surface and a level of the sixth surface, wherein a bottom surface of the second molding, the third surface, the fifth surface and the seventh surface are coplanar, wherein the second molding is in contact with the third sidewall and the fourth sidewall, and the first molding and the second molding are separated from each other by the dielectric layer.

8. The semiconductor structure of claim 7, wherein the fourth surface of the second die is entirely exposed.

9. The semiconductor structure of claim 7, wherein a width of the recess is greater than a width of the second die.

10. The semiconductor structure of claim 7, wherein the recess is disposed over a portion of an interconnect structure.

11. A semiconductor structure, comprising:
a dielectric layer;
a first die;
a second die adjacent to the first die;
a third die adjacent to the first die; and
a molding, wherein the first die, the second die and the third die are molded in the molding with different mold coverage, a thickness of the molding is consistent,
thicknesses of the first die, the second die and the third die are different from each other,
the first die, the second die, the third die and the molding are disposed over a surface of the dielectric layer,
a portion of the surface of the dielectric layer is exposed through the molding,
a sidewall of the first die is partially covered by the molding and partially exposed through the molding,
a plurality of sidewalls of the second die is entirely exposed through the molding, and
a portion of a top surface of the third die is partially covered by the molding such that
a level of a top surface of the molding is between a level of a top surface of the first die and the top surface of the third die, wherein a bottom surfaces of the molding, the first die, the second die and third die are coplanar, and the molding is in contact with the sidewall of the first die and a sidewall of the third die.

12. The semiconductor structure of claim 11, wherein a sidewall of the third die is entirely covered by the molding.

13. The semiconductor structure of claim 1, wherein a thickness of the second molding is less than a thickness of the second die and greater than a thickness of the third die.

14. The semiconductor structure of claim 7, wherein a thickness of the second molding is consistent.

15. The semiconductor structure of claim 1, wherein a thickness of the second molding is consistent.

16. The semiconductor structure of claim 3, wherein the level of the top surface of the second molding is between the level of the fourth surface of the second die and the level of the sixth surface of the third die.

17. The semiconductor structure of claim 7, wherein the level of the top surface of the second molding is between a level of the fourth surface of the second die and the level of the sixth surface of the third die.

* * * * *